US 6,251,806 B1

(12) United States Patent
Chang et al.

(10) Patent No.: US 6,251,806 B1
(45) Date of Patent: Jun. 26, 2001

(54) METHOD TO IMPROVE THE ROUGHNESS OF METAL DEPOSITION ON LOW-K MATERIAL

(75) Inventors: Chung-I Chang; Lai-Juh Chen, both of Hsinchu (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

(21) Appl. No.: 09/373,251

(22) Filed: Aug. 12, 1999

(51) Int. Cl.[7] ................................................ H01L 21/31
(52) U.S. Cl. ............................................ 438/782; 438/795
(58) Field of Search ........................................ 438/782, 795

(56) References Cited

U.S. PATENT DOCUMENTS

| | | | |
|---|---|---|---|
| 4,537,811 | 8/1985 | Nablo ................................. | 428/166 |
| 4,543,268 | 9/1985 | Sidney et al. ........................ | 427/44 |
| 4,594,262 | 6/1986 | Kreil et al. .......................... | 427/44 |
| 6,162,743 | * 12/2000 | Chu et al. ........................... | 438/781 |

OTHER PUBLICATIONS

Wong et al., "Barrier/Seed Layer Requirements for Copper Interconnects", 1998 IEEE, IITC 98 107–109.
Ryu et al., "Effect of Texture on the Electromigration of CVD Copper", 1997 IEEE, pp. 201–205.
Cho et al., "Grain size dependence of electromigration induced failures in narrow interconnects", 1989, American Institute of Physics, Appl. Phys. Lett. 54 (23), Jun. 19, 1989, pp. 2577–2579.
Ryu et a., "Electromigration of Submicron Damascene Copper Interconnects", 1998 IEEE, Symposium on VLSI Technology Digest of Technical Papers, pp. 156–157.

* cited by examiner

Primary Examiner—Richard Booth
Assistant Examiner—Lynne A. Gurley
(74) Attorney, Agent, or Firm—George O. Saile; Stephen B. Ackerman

(57) ABSTRACT

A new method is provided to treat the surface of a low-k material. The invention is specifically aimed at the improvement of the TaN barrier layer that is used in the deposition of a dual damascene structure. The invention uses e-beam exposure to improve the barrier metal (PVD TaN) properties for copper and low-k applications.

36 Claims, 4 Drawing Sheets

(1) BEFORE TREATMENT (2) REGION A; DECOMPOSITION (3) REGION B; ELIMINATION (4) REGION C; DEPLETION

METHOD TO IMPROVE THE ROUGHNESS OF METAL DEPOSITION ON LOW-K MATERIAL

BACKGROUND OF THE INVENTION (1) Field of the Invention

The invention relates to the fabrication of integrated circuit devices, and more particularly, to a method to improve the roughness of metal deposition on low-k material.

(2) Description of the Prior Art

In the manufacturing of semiconductor devices, the industry is continuously striving to improve device performance by reducing device size while at the same time reducing the device cost. The reduction of device feature size to the micron and sub-micron scale has succeeded in improving device performance while also meeting cost objectives. Important parameters in the device manufacturing are internal resistances and capacitances, these potentially performance-limiting parameters frequently require sophisticated methods of control and manufacturing that can contribute significantly to device cost. The control of these parameters also frequently leads to methods of layer deposition and surface control that manipulate and influence these surfaces on the molecular level. Underlying layer surface roughness for instance can have a significant impact on the smoothness of the overlying layer and therefore have a significant impact on the resistivity of this overlying layer. Micro-miniaturization has in many instances been accomplished by advances in several semiconductor fabrication disciplines, including photolithography and Reactive Ion Etching (RIE). The use of more sophisticated exposure cameras as well as the use of more sensitive photoresist materials have allowed sub-micron images to be routinely produced in photoresist materials. In addition, similar advances in dry etching apparatus and procedures have allowed the sub-micron images in photoresist to be successfully transferred to underlying materials that are used for the fabrication of silicon chips.

In the evolution of integrated circuit chips, scaling down feature size improves performance of internal devices in the chips by increasing the speed and functional capability of the devices. As the devices get smaller, however, their performance becomes more heavily dependent on the interconnections between them. Likewise, as the number of devices per chip increases, the area required to route the interconnect lines exceeds the area occupied by the devices. This normally leads to integrated circuit chips with multi-level interconnect schemes.

In the creation of metal interconnect lines and contact or via plugs, copper is often the preferred metal due to its low resistivity, high electromigration resistance and stress voiding resistance. Copper however readily diffuses into commonly used insulating materials such as silicon oxide and oxygen-containing polymers. For instance, copper tends to diffuse into polyimide during high temperature processing of the polyimide. This can lead to severe corrosion of the copper and the polyimide due to the copper combining with oxygen in the polyimide. The corrosion may result in loss of adhesion, delamination, voids, and ultimately a catastrophic failure of the component. A copper diffusion barrier is therefore often required.

In a typical construction of for instance a damascene structure, a diffusion barrier is deposited over the inside of the opening for this structure. In many applications, a seed layer is then deposited over the barrier layer over which a layer of copper, for copper damascene structures, is deposit. The microstructure of the (electroplated) copper is highly dependent on the characteristics of the underlying barrier and seed layers. A smooth and strongly textured copper seed layer is required to assure that the overlaying layer of copper (that makes up the damascene plug) is highly textured and has a large grain content. These latter properties are required to enhance the reliability of the damascene structure. If, in the device feature size in the deep sub-micro range, a fine grain structure is created in the deposited layer of copper, the electromigration lifetime of the deposited layer of copper will be degraded. In trenches, the electroplated copper has a relatively large grain structure resulting in no degradation of the copper reliability in deep trenches. The electromigration performance of electroplated copper is therefore superior to that of CVD copper especially for deep sub-micron Damascene interconnects.

As semiconductor devices continue to be scaled down, interconnect delay becomes the performance barrier for high-speed silicon integrated circuits (IC's). The increased interconnect delay will reduce device speed and exaggerate the problem of high cross talk and power dissipation. Low resistivity metal (Cu) and low dielectric constant insulator are the potential candidates to reduce the increased interconnect delay. Thus, Cu interconnect for backend-of-line (BEOL) has been proposed to improve chip performance. It is desired to integrate Cu and low-k dielectric to further improve the performance. Organic polymers are generally known to exhibit a lower dielectric constant than oxide and nitride, and thus are considered as candidates for deep sub-micron inter-metal dielectric. Several annealing techniques such as ion implantation and plasma treatment have been found to be able to improve spin-on dielectric properties. Recently, a novel electron beam (e-beam) curing method has been adopted to improve spin-on-glass (SOG) properties and to prevent plasma damage during the step of via opening. The high-energy electrons penetrate the dielectric film and transfer the electron energy to the dielectric material. It has been found that e-beam cured SOG has superior performance when compared with SOG that has been thermally cured.

In a number of case studies the effect of grain size in narrow interconnects has been studied, specifically the impact that grain size has on Mean Time To Failure (MTTF) and Electromigration Induced failure. It has been found that, as the ratio of the line width to the grain size decreases, MTTF decreases to a minimum and then increases exponentially. Electromigration Induced failure increases continuously. Another study has reported on the impact on electromigration of (111) or (200) textured CVD copper films. This study has found that the electromigration lifetime of (111) CVD copper is about four times longer than the electromigration lifetime of (200) CVD copper, this under equal conditions of activation energy (about 0.8 eV) for both types of textured CVD Cu films. The above-cited studies have been listed in the enclosed list of patents and articles.

Chung- I Chang, et. al., "A Novel E-Beam Treatment Technique To Improve TaN Barrier Properties for Dual Damascene Cu And Low-K Integration."

Wong et al., "Barrier/Seed Layer Requirements for Copper Interconnects".

Changsup Ryu, et al., "Electromigration of Submicron Damascene Copper Interconnects", pp. 156–157, 1998 Symposium n VLSI Technology Digest of Technical papers.

J. Cho, et. al., "Grain Size dependence of electromigration induced failures in narrow interconnects", Appl. Phys. Lett. 54(25), Jun. 19, 1989, pp. 2577–2579.

Changsup Ryu, et al., "Effect of Texture on the Electromigration of CVD Copper", IEEE 9/1997 pp. 201 to 205.

U.S. Pat. No. 4,537,811 (Nablo) shows an E-beam process for e-beam curing of coatings.

U.S. Pat. No. 4,543,268 (Sidney et al.) shows an E-beam adhesion promoting treatment.

U.S. Pat. No. 4,594,262 (Kreil et al.) discloses an e-beam adhesion promoting treatment of polyester film base.

SUMMARY OF THE INVENTION

A principle objective of the invention is to improve the roughness of metal deposition on the surface of a low-k material.

Another objective of the invention is to reduce electromigration lifetime degradation of layers deposited over low-k material.

Yet another objective of the invention is to reduce electromigration-induced failures in narrow interconnects due to grain size dependence.

A still further objective of the invention is to improve the quality of metal that is deposited over a low-k material.

A still further objective of the invention is to improve the deposition of barrier/seed layers in the formation of copper interconnects.

A still further objective of the invention is to improve TaN barrier properties for dual damascene copper structures.

In accordance with the objectives of the invention a new method is provided to treat the surface of a low-k material. The invention is specifically aimed at but not limited to the improvement of the TaN barrier layer that is used in the deposition of a dual damascene structure. The invention uses ebeam exposure to improve the barrier metal (PVD TaN) properties for copper and low-k applications.

DESCRIPTION OF THE PREFERRED EMBODIMENTS

Figure 1:
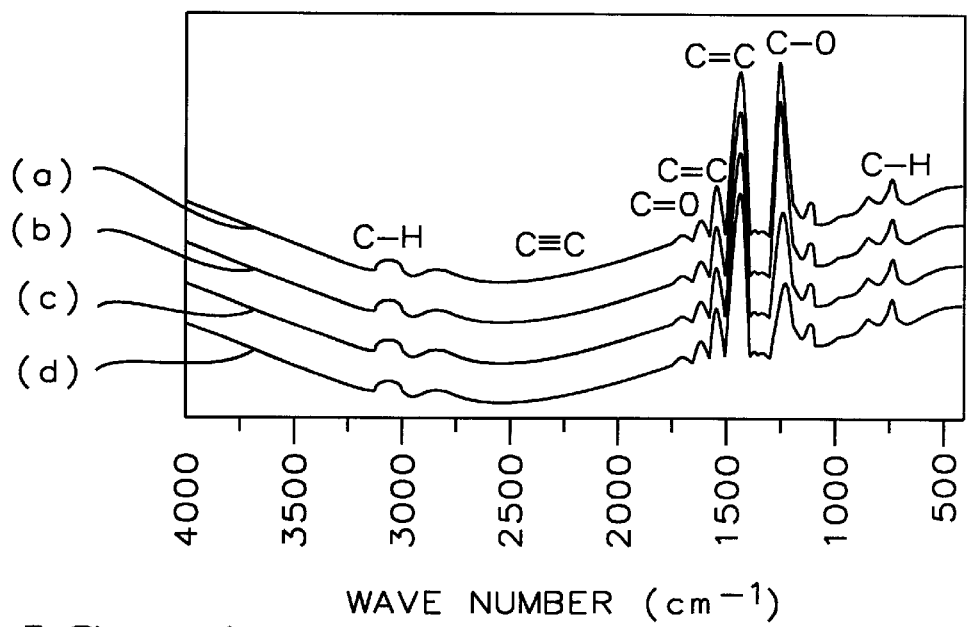
FIG. 1 shows a FTIR spectra of low-k film after various treatments of the low-k film.

Some of the major points that relate to the invention and that previously have been stated or that form part of the following discussion are highlighted in the following two paragraphs.

Due to the continued improvements that are being made in the design of semiconductor devices and the concurrent need to reduce device feature size, problems of interconnect delay, cross talk and power dissipation become increasingly more acute. The use of low-k materials in the creation of semiconductor devices has long been accepted as a positive factor in addressing these problems. What has in this not received adequate attention is the fact that the surface roughness of low-k materials can affect the thereover deposited TaN barrier layer and the copper seed layer and the thereover deposited (plated) layer of copper. Conventional curing of the deposited low-k material does not by itself solve this problem.

A low-k material, such as poly-ether or a polyimide, that has been evenly spin coated on the surface of a silicon substrate, can be thermally cured to solidify it. After photolithography, to make the design pattern, the low-k material is submitted to e-beam exposure resulting in a smoother surface of the low-k material that carries through into smoother surfaces for the thereover deposited barrier layer of TaN, the copper seed layer and the copper plated layer for the interconnect pattern. The deposited layer of copper has larger grain size resulting in improved delay performance and improved reliability of this layer.

The material that is presented at this time in support of the invention is dependent on the above cited publication by Chung- I Chang, et al.: "A Novel E-Beam Treatment Technique To Improve TaN Barrier Properties for Dual Damascene Cu And Low-K Integration". This publication has been written for the Department of Deep Submicron Technology Development of ERSO/ITRI, located at Chung Hsing Road, Chutung, Hsinchu, Taiwan.

In this paper, a novel surface treatment technique is proposed that uses flood electron beam to improve the properties of barrier metal (PVD TaN) for Cu or low-k dual damascene application. It has been shown that the flood electron beam can remove organic residue from the surface of low-k material. It is expected that a surface from which organic residue has been removed is well suited for the deposition of PVD TaN over this surface. The effects of different electron beam operating conditions and the mechanisms of surface modification have been investigated as part of this paper. A new parameter for flood electron beam process has been defined to correlate the degree of surface modification. This parameter is being referred to as "Area Energy" and is defined as the applied electron voltage multiplied by applied dosage, both parameters relating to processes that are performed on a layer of low-k material. The results of the experiments suggest that there exist a number of different reactions that are dependent on the Area Energy of the electron beam that is used for the exposure of the low-k material. The results that have been obtained in measuring contact angle (of treated low-k samples) and the roughness of TaN film (that has been sputtered over these low-k samples after e-beam treatment) support this conclusion.

The application of an e-beam curing process on low dielectric constant material is attractive since this curing process has high potential to improve thin film properties of organic polymer. In the experiments that have been performed in support of the invention, the characterization of the film surface of e-beam cured low-k polymer has been done by measuring surface roughness and contact tangle of the surfaces that have been studied. Fourier Transform Infrared (FTIR) analysis was used to analyze the change in composition of film bulk. For the dual damascene copper process, the effects of curing conditions on subsequently sputtered TaN (deposited as for instance the copper diffusion barrier metal) was studied. The previously defined parameter of Area Energy was used to correlate the degree of surface modification. Three different mechanisms have been observed that can be correlated with the Area Energy.

A low-k material that has been used in studies that were performed in support of the invention is carbon-based polymer with poly-arylene ether chemistry. The as-coated dielectric constant is around 2.8 when the film is completely cured. The films were coated and baked on a conventional SOG coater. Samples were cured in a furnace at 400 degrees C. for the duration of 1 hour in an $N_2$ ambient to compare the film properties with e-beam cured samples. The experiments on the low-k films were carried out using a flood electron beam system. The e-beam process was operated at room temperature, in Ar ambient, dosage and electron voltage were set for different conditions. Use was made of the concepts of polarization (causing light to vibrate in a definite pattern) and ellipsometry (the science of using a polarimeter designed especially for determining the ellipticity of polarized light). Ellipsometry and FTIR were used to measure the change of film thickness and chemical bond before and after treatment. Contact angle meter was used to determine surface energy of treated lock material. To investigate the effect of e-beam treatment on PVD TaN, a TaN film of 500 Angstrom was deposited at 300 degrees C. on the surface of a low-k material using different curing conditions for the deposited TaN film. The TaN film was sputtered in a long throw sputtering PVD. A High Resolution Profiler (HRP) was used to measure the surface roughness. The results obtained during the above-indicated experiments will be highlighted with the help of a number of graphic presentations that are part of this paper.

Figure 2:
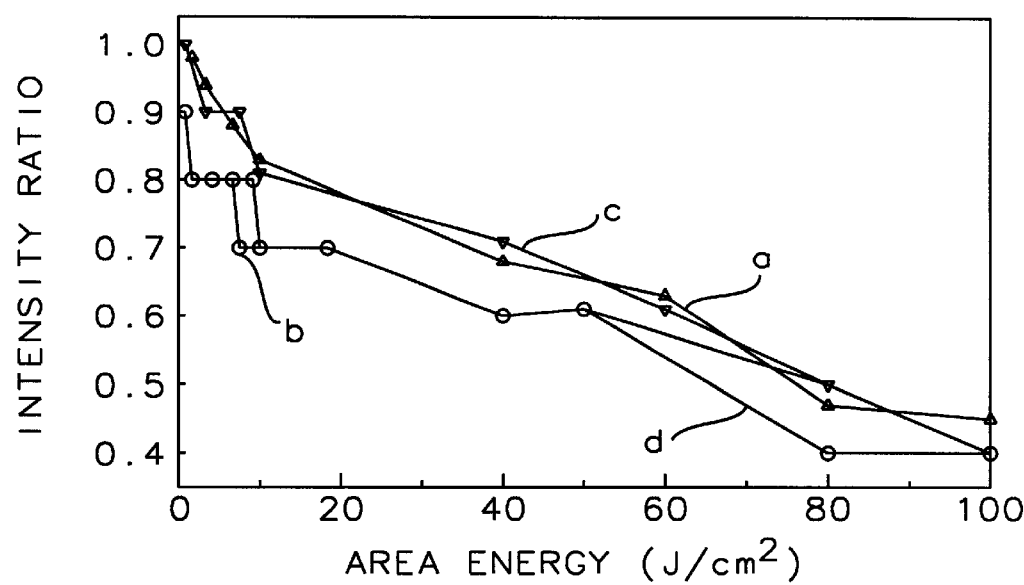
FIG. 2 shows a graph of intensity ratios as a function of energy that is applied to the surface of low-k film.

FIG. 1 shows the FTIR spectra of low-k samples that have undergone the treatments of (a) as-baked, (b) thermally cured, (c) e-beam treated (with 40 $J/cm^2$ area energy) after thermal curing, and (d) e-beam cured (with 100 $J/cm^2$ area energy). The wave number is plotted along the X-axis while the spectral measurement is plotted along the Y-axis. The absorption indicated at the wave numbers of 1500 and 1590 $cm^{-1}$ represents the absorption for C=C bonds, a wave number of 1240 $cm^{-1}$ represents the absorption for C—O bond, at 2220 $cm^{-1}$ for C≡C bond, at 747 $cm^{-1}$ for C—H bonding and at 3060 $cm^{-1}$ for C—H bond stretching. According to FIG. 1, the C≡C bond will disappear after the thermal curing or the e-beam curing process. This means that the polymer became cross-linked after the breaking of the C≡C bond. As shown in FIG. 1, the carbon related bonds were suppressed for thermally cured and for e-beam cured samples. To quantify the degree of suppression, an intensity ratio is derived, and the result is shown in FIG. 2. The reference intensity for all FTIR peaks of interest is the intensity value of the non-cured sample. The intensity ratio of all curves decreases gradually with the increase of Area Energy. The Area Energy is defined as the operating voltage (in kV) multiplied by the operating dosage (in $mC/cm^2$).

FIG. 2 shows the relation between the Area Energy (X-axis) and the intensity ratio (Y-axis) for low-k samples after various treatments of (a) C=C as-baked, (b) C=C thermally cured, (c) C—O as baked and (d) C—O thermally cured.

FIG. 2 shows that high-energy electron collisions have changed the carbon related bond structure of the low-k polymer. In other words, high-energy electrons broke carbon-related bond in low-k polymer and seemed to induce re-polymerization in the film. Moreover, a distinguishable double layer structure was observed in the e-beam treated low-k film when the Area Energy is large enough.

Since the e-beam treatment reduces the carbon-related bond in low-k film, the wettability of the film is changed after the curing process. Thin film wettability is an important factor for subsequent chemical processing. Wetting experiments were performed using the "sitting drop" method in air under room temperature.

Figure 3:
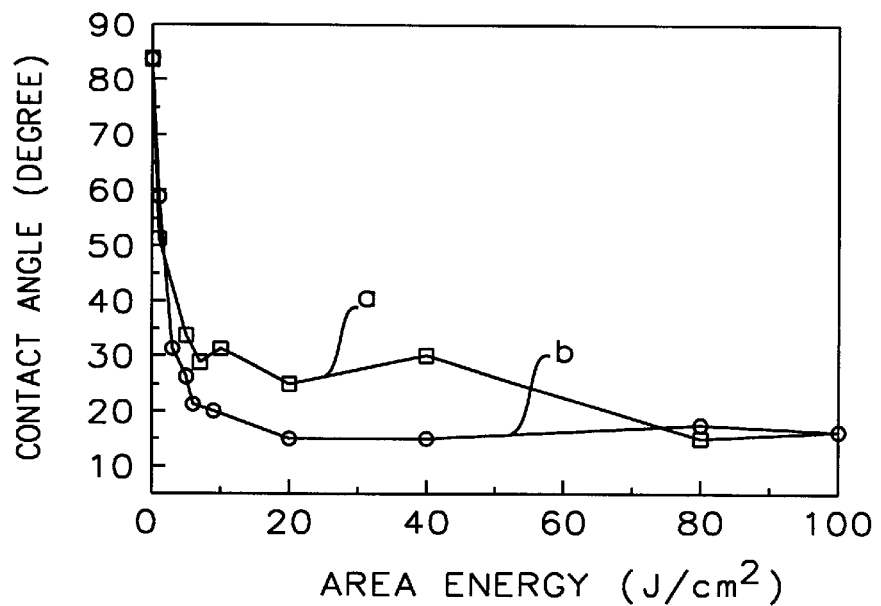
FIG. 3 shows a graph of the contact angle as a function of applied Area Energy for films that have been exposed to various treatments.

FIG. 3 presents the results of contact angle measurements for thermally cured (curve a) and as-baked (curve b) low-k samples after treatment using different Area Energy of the flood electron beam. In FIG. 3, the Area Energy is plotted along the X-axis while the contact angle is plotted along the Y-axis. It is clear that non-treated samples have hydrophobic (resisting to or avoiding wetting) characteristics. This suggests that the surface of non-treated low-k materials (both thermally cured and as-baked) contain large groups of hydrophobic residues. As mentioned earlier, high-energy electrons break the carbon-related bonds and possibly eliminate large groups of hydrophobic residues from low-k surfaces. Therefore, as shown in FIG. 3, the contact angle decreases with increasing Area Energy for both thermally cured and as-baked low-k samples. In other words, the surface characteristics of low-k materials become more hydrophilic with the increase of the Area Energy of flood electrons. However, the value of the contact angle is getting saturated at an Area Energy larger than 10 $J/cm^2$ suggesting that the surface of the treated low-k film contains more hydrophilic (readily wet by water) bonds than hydrophobic bonds. Also FIG. 3 suggests that the large groups of hydrophobic residues are completely decomposed as the electron Area Energy increases to larger than 40 $J/cm^2$. Since the value of the contact angle is a measurement of surface energy, this suggests that the surface energy of low-k material is changed when the wafers are subjected to e-beam treatment. It is therefore to be expected that the interface of low-k material and the subsequently deposited barrier metal will be changed in accordance with the e-beam treatment.

Figure 4:
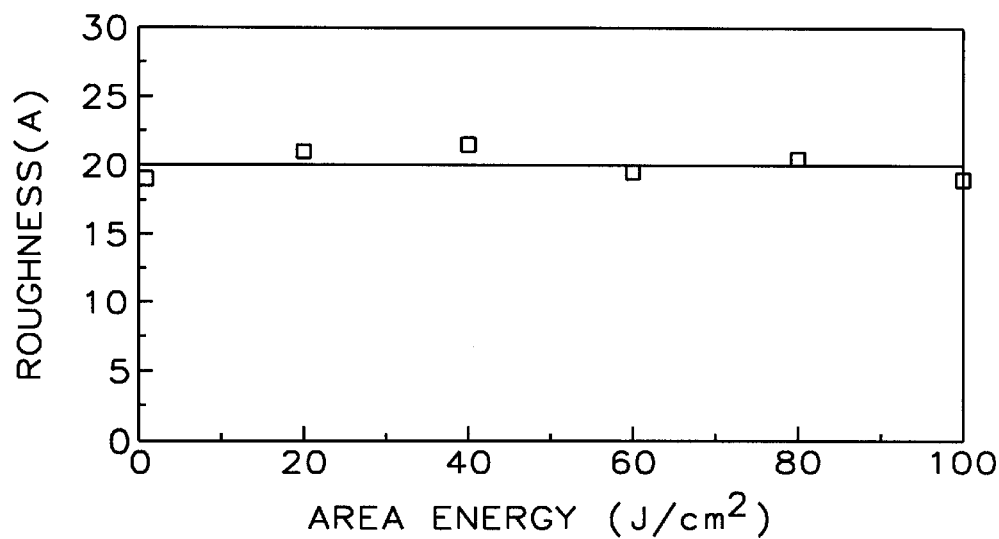
FIG. 4 shows a graph of film surface roughness as a function of exposed Area Energy.

The subject of surface roughness will be addressed next. To investigate the changes affected by the different treatment conditions on the interface between low-k material and the subsequently deposited barrier metal (TaN), a LTS PVD TaN layer was deposited on low-k samples. Following the deposition, a High Resolution Profiler (HRP) was used to measure the roughness of the deposited TaN film. A set of comparative experiments was performed to determine the surface roughness before TaN deposition. In FIG. 4, the Area Energy is plotted along the X-axis while the Roughness is plotted along the Y-axis. As shown in FIG. 4, the roughness of low-k films after various surface energy treatments is almost identical. That means that e-beam treatment will not change surface roughness of low-k material.

Figure 5:
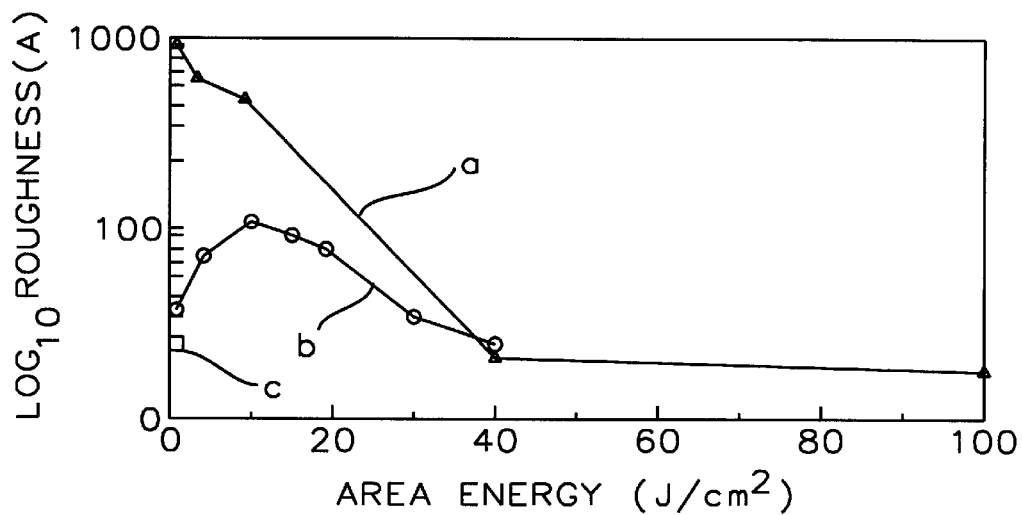
FIG. 5 shows a graph of surface roughness of a layer of TaN deposited over a layer of film that has been exposed to various treatments.

The roughness measurement performed on TaN film is shown in FIG. 5. The Area Energy is plotted along the X-axis while a measure of the TaN roughness is plotted along the Y-axis. Two curves are shown in FIG. 5, curve (a) represents the as-baked sample while curve (b) represents the thermally cured sample. Reference point (c) marks the comparative roughness of Ta/PE-oxide. For the as-baked sample, the surface roughness is reduced with increased Area Energy. However, for the thermally cured sample, the roughness of TaN film increases with increasing of the flood Area Energy if the Area Energy is less than 10 $J/cm^2$. The highest TaN roughness was obtained using the treatment condition of 10 $J/cm^2$ Area Energy. The TaN roughness is reduced only by increasing the Area Energy when the Area Energy is larger than 10 $J/cm^2$. To compare the results, a control sample of TaN deposited on PECVD $SiH_4$ oxide was created and analyzed. The TaN/PE-oxide sample was used as the ideal standard. As is shown in FIG. 5, this ideal roughness can be reached when the Area Energy is large enough (for instance 40 $J/cm^2$). FIG. 5 shows that the as-baked sample is rougher than thermally cured samples.

This is because the as-baked samples suffer from problems caused by outgassing during LTS PVD TaN deposition when the Area Energy is less than 40 J/cm². For the as-baked samples, the TaN roughness is compatible with TaN/PE-oxide samples when the flood electron Area Energy is larger than 40 J/cm². On the other hand, TaN roughness of thermally cured sample is comparatively smoother than the as-baked low-k sample. This indicates that the thermally cured samples have less problems of outgassing during barrier metal deposition.

Figure 6:
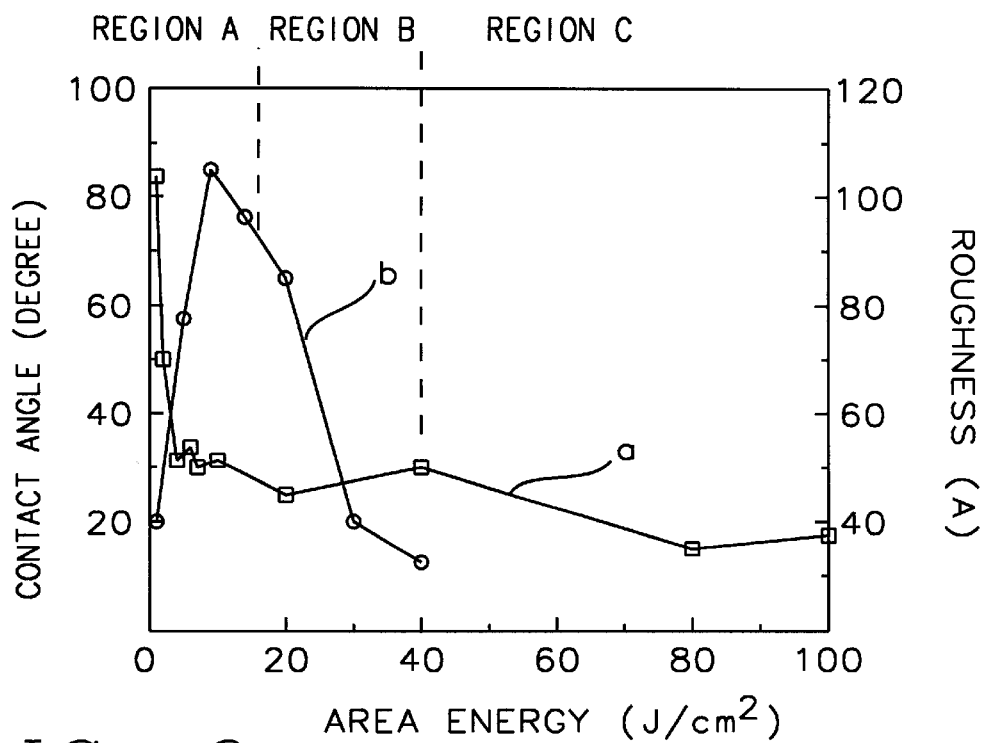
FIG. 6 shows the relationship between applied e-beam energy, the contact angle and TaN surface roughness.

To explore the impact of TaN surface roughness, a comparative graph was created for the contact angle and the TaN surface roughness (FIG. 6). In FIG. 6, the Area Energy is plotted along the X-axis while the Contact Angle (in degrees) and the roughness are plotted along the Y-axis. In FIG. 6, three regions have been identified as region A (0 to 10 J/cm² Area Energy), region B (10 to 40 J/cm² Area Energy), and region C (>40 J/cm² Area Energy) in accordance with a continuous increase in electron Area Energy. Two curves are shown in FIG. 6, that is a contact angle curve (a) and a roughness curve (b). In region A, the TaN roughness increases with increasing electron Area Energy, however, the contact angle of treated low-k material decreases. In region B, both TaN surface roughness and contact angle of treated low-k film are reduced with the increase of electron Area Energy. In region C, the contact angle is saturated. To explain this phenomena, an absorption and desorption mechanism is proposed as illustrated in FIG. 7.

Figure 7A:
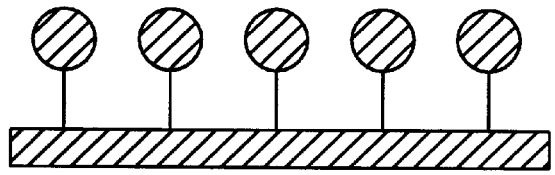
FIGS. 7a through 7d show the surface modifications of low-k film during various electron energy treatments.
Figure 7B:
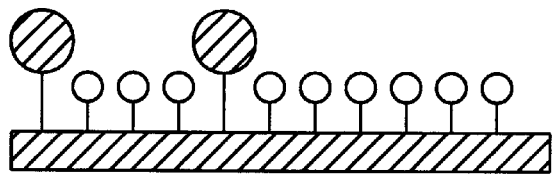
Figure 7C:
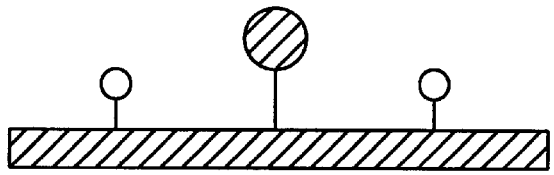
Figure 7D:
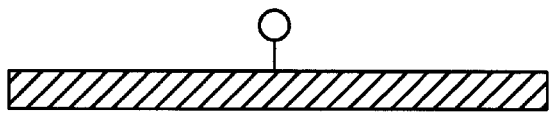

FIG. 7 shows the surface modification of low-k film during various electron area energy treatments and is made up of the four figures, as follows:

FIG. 7a represents before treatment
FIG. 7b represents Region A and decomposition
FIG. 7c represents Region B and elimination
FIG. 7d represents Region C and depletion.

The large dots in FIG. 7 represent the large size hydrophobic group while the small dots represent the small size residue.

As shown in FIG. 7, a significant amount of hydrophobic residue exists in the non-treated low-k materials. These residues will result in the hydrophobic characteristics of low-k film. With the implementation of the high-energy flood electron beam treatment, the large size hydrophobic residue is decomposed to several smaller residues (region A, FIG. 7). This smaller residue will occupy more area on the surface of low-k material. Therefore, the PVD TaN films are getting rougher as the area occupied by residues/impurities on the reactive surface increases. However, with the breakage of large hydrophobic residues, the surface becomes more hydrophilic and the contact angle decreases. As the Area Energy is increased even further, the flood high-energy electrons will remove either the smaller residues or the remaining large size residues. The surface becomes "cleaner" for the subsequent material deposition (regions B and C, FIG. 7). Thus, the roughness of the TaN film is continuously reduced. The surface is expected to be perfectly "clean" if the electron Area Energy is large enough (higher than 40 J/cm²). If the electron Area Energy is higher than 40 J/cm², it is possible to induce a dual layer structure in the bulk of the low-k material. Therefore the method of e-beam treatment is recommended to be adopted for treatment of low-k surfaces with an operating electron Area Energy smaller than 40 J/cm².

It can be said in conclusion that the invention provides a novel flood electron beam treatment technique for low-k materials to improve the Cu barrier metal TaN properties for dual damascene Cu application and low-k integration. FTIR spectra shows that the intensity of carbon related peaks have been suppressed after e-beam curing process. E-beam process was used to modify the properties of film surfaces. To quantify the degree of modification, contact angle and surface roughness measurements were made and compared. A new parameter Electron Area Energy is defined to correlate the degree of surface modification. The surface modification process can be divided into three different mechanisms. The low-k films were found to behave hydrophobically before e-beam treatment. The large size hydrophobic residues are decomposed into small residues and finally removed completely. The clean surface of treated low-k film results in a smoother PVD TaN film. Thus, the PVD TaN properties can be improved by this surface modification technique.

The invention, in summation, provides a method that replaces the Prior Art method of depositing a layer of PECVD oxide over the silicon surface and depositing the TaN over the layer of PECVD oxide. Under the invention a low-k material, such as poly-ether or any polyimide type material, is deposited over the silicon surface, deposited typically by CVD spin-on technology and baking the low-k material for between about 1 and 2 minutes at 350 degrees C. After this, thermally cure the low-k material at about 400 degrees C. for about 1 hour. Before depositing the layer of TaN, the low-k material is exposed to ebeam energy at an Area Energy of about 0 to 100 J/cm². It has been found that the roughness of the deposited TaN has been reduced from about 26 Angstrom (under the Prior Art method of deposition) to about 20 Angstrom. From this it follows that the seed layer that is deposited over the layer of TaN (under the deposition method of the invention) is smoother resulting in a smoother and larger grain layer of copper that is plated over the seed layer. The final result of the procedure of the invention is to create cooper plated deposits that provide interconnect lines with reduced (signal propagation) delay and improved reliability.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for providing a substrate with a coating of predetermined external surface texture, comprising:

providing a semiconductor substrate;

applying an electron-beam curable, low viscosity, solid coating to the surface of said substrate;

curing said coating; and subjecting said coating to electron-beam energy after a dwell time following said applying an electron-beam curable, low viscosity, solid coating to the surface of said substrate.

2. The method of claim 1 wherein said curing said coating is baking said coating for between about 1 and 2 minutes at 350 degrees C. after which thermally curing said coating at about 400 degrees C. for about 1 hour.

3. The method of claim 1 wherein said electron-beam curable, low viscosity, solid coating is a layer of low k dielectric material.

4. The method of claim 1, said electron-beam curable, low viscosity, solid coating comprising:
a level of dielectric being applied for creation of a dual damascene structure;
said level of dielectric forming an underlying layer to a barrier layer;
said barrier layer comprising TaN; and
said barrier layer forming a barrier layer for a copper dual damascene structure.

5. The method of claim 1, said electron-beam curable, low viscosity, solid coating comprising:
a level of dielectric being applied for creation of a multiplicity of overlying dual damascene structures;
said level of dielectric forming an underlying layer to a barrier layer;
said barrier layer comprising TaN; and
said barrier layer forming a barrier layer for a copper dual damascene structure within said multiplicity of overlying dual damascene structures.

6. The method of claim 1, said electron-beam curable, low viscosity, solid coating comprising:
a dielectric;
said dielectric being an underlying layer to a barrier layer;
said barrier layer comprising TaN; and
said barrier layer being a barrier layer for a copper dual damascene structure.

7. The method of claim 1 wherein said dwell time is sufficiently short to prevent said coating from relaxing into conformity with the substrate surface and from substantial penetration into the surface of said substrate.

8. The method of claim 1 wherein said dwell time is between about one second and a fraction thereof.

9. The method of claim 1 wherein said subjecting said coating to electron-beam energy is adjusting said electron beam energy to sufficient value, dose, coverage and penetration power thereby curing said coating uniformly throughout its thickness and extent.

10. The method of claim 1 wherein said low viscosity is between about ten and one hundred cp.

11. The method of claim 1 wherein said electron-beam curable, low viscosity, solid coating is applied to a thickness between about 3000 and 10000 Angstrom.

12. The method of claim 11 wherein said electron beam curable, low viscosity, coating thickness and said dwell time is adjusted to produce a coating that is externally defect free and has a smooth, glass-like surface.

13. The method of claim 1 in which a further surface requiring a smooth surface is deposited over the surface of said electron-beam curable, low viscosity, solid coating.

14. The method of claim 13 wherein said further surface is a barrier layer wherein said barrier layer contains TaN wherein furthermore said barrier layer forms the barrier layer to a copper dual damascene structure.

15. The method of claim 1 wherein said coating is applied over a base layer or a oxide layer or an insulating layer that has been deposited on the surface of said substrate prior to the application of said coating.

16. A method for providing a substrate with a coating of predetermined external surface texture, comprising:
providing a semiconductor substrate;
applying an electron-beam curable, low viscosity, solid coating to the surface of said substrate;
curing said coating; and
subjecting said coating to electron-beam energy after a dwell time following said applying an electron-beam curable, low viscosity, solid coating to the surface of said substrate, said electron beam energy being adjusted within a range of a high power voltage supply of between about 1 and 20 keV, with a low power supply voltage of between about 0 and 20 volt and with a dose between about 0.10 and 5 megarads.

17. The method of claim 16 wherein said curing said coating is baking said coating for between about 1 and 2 minutes at 350 degrees C. after which thermally curing said coating at about 400 degrees C. for about 1 hour.

18. The method of claim 16 wherein said electron-beam curable, low viscosity, solid coating is a layer of low k dielectric material.

19. The method of claim 16, said electron-beam curable, low viscosity, solid coating comprising:
a level of dielectric being applied for creation of a damascene of dual damascene structure;
said level of dielectric forming an underlying layer to a barrier layer;
said barrier layer comprising TaN; and
said barrier layer forming a barrier layer for a copper dual damascene structure.

20. The method of claim 16 wherein said dwell time is between about one second and a fraction thereof.

21. The method of claim 16 wherein said low viscosity is between about ten and one hundred cp.

22. The method of claim 16 wherein said electron-beam curable, low viscosity, solid coating is applied to a thickness between about 3000 and 10000 Angstrom.

23. A method for providing a substrate with a coating of predetermined external surface texture, comprising:
providing a semiconductor substrate;
applying an electron-beam curable, low viscosity, solid coating to the surface of said substrate;
curing said coating; and
subjecting said coating to electron-beam energy after a dwell time following said applying an electron-beam curable, low viscosity, solid coating to the surface of said substrate, said subjecting said coating to electron-beam energy is exposing said coating to e-beam energy at an Area Energy of about 0 to 150 $J/cm^2$, said Area Energy being defined as an applied e-beam electron high power voltage multiplied by an applied e-beam dosage.

24. The method of claim 23 wherein said curing said coating is baking said coating for between about 1 and 2 minutes at 350 degrees C. after which thermally curing said coating at about 400 degrees C. for about 1 hour.

25. The method of claim 23 wherein said electron-beam curable, low viscosity, solid coating is a layer of low k dielectric material.

26. The method of claim 23, said electron-beam curable, low viscosity, solid coating comprising:
a level of dielectric being applied for creation of a damascene of dual damascene structure;
said level of dielectric forming an underlying layer to a barrier layer;
said barrier layer comprising TaN; and
said barrier layer forming a barrier layer for a copper dual damascene structure.

27. The method of claim 23 wherein said dwell time is between about one second and a fraction thereof.

28. The method of claim 23 wherein said low viscosity is between about ten and one hundred cp.

29. The method of claim 23 wherein said electron-beam curable, low viscosity, solid coating is applied to a thickness between about 3000 and 10000 Angstrom.

30. A method for providing a substrate with a coating of predetermined external surface texture, comprising:

providing a semiconductor substrate;

applying an electron-beam curable, low viscosity, solid coating to the surface of said substrate;

curing said coating; and subjecting said coating to electron-beam energy after a dwell time following said applying an electron-beam curable, low viscosity, solid coating to the surface of said substrate, said e-beam energy being provided by an e-beam, said e-beam being part of an e-beam system, said e-beam system operating under conditions of a high voltage power supply applied to a photo cathode between about 1 and 20 kV, with a low voltage supply applied to an anode between about 10 and 30 volts, with a background pressure of about 1E-7 Torr and an operational pressure between about 10 and 30 mTorr.

31. The method of claim 30 wherein said curing said coating is baking said coating for between about 1 and 2 minutes at 350 degrees C. after which thermally curing said coating at about 400 degrees C. for about 1 hour.

32. The method of claim 30 wherein said electron-beam curable, low viscosity, solid coating is a layer of low k dielectric material.

33. The method of claim 30, said electron-beam curable, low viscosity, solid coating comprising:

a level of dielectric being applied for creation of a damascene of dual damascene structure;

said level of dielectric forming an underlying layer to a barrier layer;

said barrier layer comprising TaN; and said barrier layer forming a barrier layer for a copper dual damascene structure.

34. The method of claim 30 wherein said dwell time is between about one second and a fraction thereof.

35. The method of claim 30 wherein said low viscosity is between about ten and one hundred cp.

36. The method of claim 30 wherein said electron-beam curable, low viscosity, solid coating is applied to a thickness between about 3000 and 10000 Angstrom.

* * * * *